(12) United States Patent
Davis

(10) Patent No.: US 6,919,723 B2
(45) Date of Patent: Jul. 19, 2005

(54) METHOD AND APPARATUS TO AUTOMATICALLY MAINTAIN LOOP ISOLATION IN POSITION VARIANT MRI COILS

(75) Inventor: Steven C. Davis, Oconomowoc, WI (US)

(73) Assignee: General Electric Company, Milwaukee, WI (US)

( * ) Notice: Subject to any disclaimer, the term of this patent is extended or adjusted under 35 U.S.C. 154(b) by 0 days.

(21) Appl. No.: 10/604,299

(22) Filed: Jul. 9, 2003

(65) Prior Publication Data
US 2005/0007116 A1 Jan. 13, 2005

(51) Int. Cl.[7] ................................................ G01V 3/00
(52) U.S. Cl. .................................................... 324/318
(58) Field of Search ................................ 324/307, 309, 324/318, 322; 600/422

(56) References Cited

U.S. PATENT DOCUMENTS

| | | | | |
|---|---|---|---|---|
| 4,825,162 A | * | 4/1989 | Roemer et al. | 324/318 |
| 5,243,289 A | * | 9/1993 | Blum et al. | 324/322 |
| 5,302,901 A | * | 4/1994 | Snelten | 324/322 |
| 5,489,847 A | * | 2/1996 | Nabeshima et al. | 324/318 |
| 5,578,925 A | * | 11/1996 | Molyneaux et al. | 324/318 |
| 5,757,189 A | * | 5/1998 | Molyneaux et al. | 324/318 |
| 5,804,969 A | * | 9/1998 | Lian et al. | 324/318 |
| 5,973,495 A | * | 10/1999 | Mansfield | 324/322 |
| 6,169,401 B1 | * | 1/2001 | Fujita et al. | 324/318 |
| 6,441,615 B1 | * | 8/2002 | Fujita et al. | 324/318 |
| 6,534,983 B1 | * | 3/2003 | Boskamp et al. | 324/318 |
| 6,590,392 B2 | * | 7/2003 | Boskamp et al. | 324/318 |

OTHER PUBLICATIONS

Roemier, P. et al., The NMR Phased Array, Magnetic Resonance in Medicine, 1990, pp. 192–225, vol. 16.

* cited by examiner

Primary Examiner—Christopher W. Fulton
Assistant Examiner—Dixomara Vargas
(74) Attorney, Agent, or Firm—Ziolkowski Patent Solutions Group, SC; Michael A. Della Penna; Carl B. Horton (57) ABSTRACT

An RF coil loop assembly technique that maintains coil isolation at varying coil positions is presented. A mutual inductance compensation circuit connected in series with each RF coil loop of the coil loop assembly substantially minimizes the coupling, or mutual inductance, that forms between the RF coil loops. The mutual inductance of the compensation circuit substantially equals, and is opposite in phase or polarity, to the mutual inductance that forms between the RF coil loops as the RF coil loops move or rotate with respect to each other.

24 Claims, 4 Drawing Sheets

METHOD AND APPARATUS TO AUTOMATICALLY MAINTAIN LOOP ISOLATION IN POSITION VARIANT MRI COILS

BACKGROUND OF INVENTION

The present invention relates generally to magnetic resonance (MR) systems and, more particularly, to an apparatus to limit coupling between moveable coils of an RF coil assembly of an MR system.

When a substance such as human tissue is subjected to a uniform magnetic field (polarizing field B0), the individual magnetic moments of the spins in the tissue attempt to align with this polarizing field, but precess about it in random order at their characteristic Larmor frequency. If the substance, or tissue, is subjected to a magnetic field (excitation field B1) which is in the x-y plane and which is near the Larmor frequency, the net aligned moment, or "longitudinal magnetization", MZ, may be rotated, or "tipped", into the x-y plane to produce a net transverse magnetic moment Mt. A signal is emitted by the excited spins after the excitation signal B1 is terminated and this signal may be received and processed to form an image.

When utilizing these signals to produce images, magnetic field gradients (Gx, Gy, and Gz) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

It is generally well-known that RF coil loops of an MR system placed adjacent to each other couple heavily by mutual inductance. This coupling causes detuning of the coil loops, loading of the loop, and degradation of image quality. To eliminate the coupling, a number of techniques and coil designs have been developed. For example, the loops may be critically overlapped to cancel the coupling, inductively coupled to cancel the coupling, capacitively coupled to cancel the coupling, or reduced by high impedance resonant circuits that turn off the loops. It has been found that the first three designs are sufficient for only one orientation of loop proximity. The fourth design has been found not to provide sufficient isolation to cancel loop coupling.

Moreover, if the coil loops are flexible, or can move relative to each other, the isolation designs described above often fail. That is, as the orientation of loop proximity changes, the RF coil loops must either be retuned to minimize the coupling at the new orientation or a different RF coil loop assembly must be used that is tuned to the new orientation. MRI system operators must therefore sacrifice patient throughput by devoting time to returning of the coil loops. Additionally, selecting a different RF coil loop assembly already tuned to the new orientation not only requires time and effort away from image acquisition, but also requires that an imaging facility maintain an inventory of a number of RF coil loop assemblies to satisfy the many orientations that may be used to acquire diagnostic data. Maintaining a large inventory of RF coil loop assemblies is cost prohibitive, and, despite extensive cost, may not be exhaustive of the coil assemblies needed.

It would therefore be desirable to design a system capable of providing an RF coil assembly such that loop isolation is maintained over a wide range of loop positions or orientations.

BRIEF DESCRIPTION OF INVENTION

The present invention is directed to an RF coil loop assembly having a dynamic mutual inductance compensation circuit that solves the aforementioned drawbacks. The present invention provides an RF coil loop assembly whereupon the coils may be brought closer together, further apart, or rotated, while maintaining good coil isolation. The mutual inductance compensation circuit connects in series with each RF coil loop to substantially minimize the coupling, or mutual inductance, that forms between the RF coil loops. The mutual inductance of the compensation circuit substantially equals, and is opposite in phase or polarity, to the mutual inductance that forms between the RF coil loops as the RF coil loops move or rotate with respect to each other.

In accordance with one aspect of the invention, an RF coil assembly is disclosed. The coil assembly includes a pair of RF coils movable with respect to one another. A first inductor assembly connects in series with one RF coil, and a second inductor assembly connects in series with the another RF coil. The inductor assemblies have a mutual inductance opposite in polarity and substantially equal in magnitude to a mutual inductance of the pair of RF coils.

In accordance with another aspect of the present invention, an MRI apparatus is disclosed. The apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The RF coil assembly includes a first moveable coil loop and a second moveable coil loop. The RF coil assembly also includes a mutual inductance compensation circuit to generate an inductance that minimizes a coupling of the first and the second moveable coil loops independent of coil loop position relative to one another.

In accordance with yet another aspect of the present invention, a method of manufacturing an RF coil assembly is disclosed. The method includes connecting a first inductor assembly in series with a first RF coil and connecting a second inductor assembly in series with a second RF coil. The method further includes calibrating the first inductor assembly and the second inductor assembly such that a mutual inductance therebetween substantially isolates the first and the second RF coils independent of coil position relative to one another.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
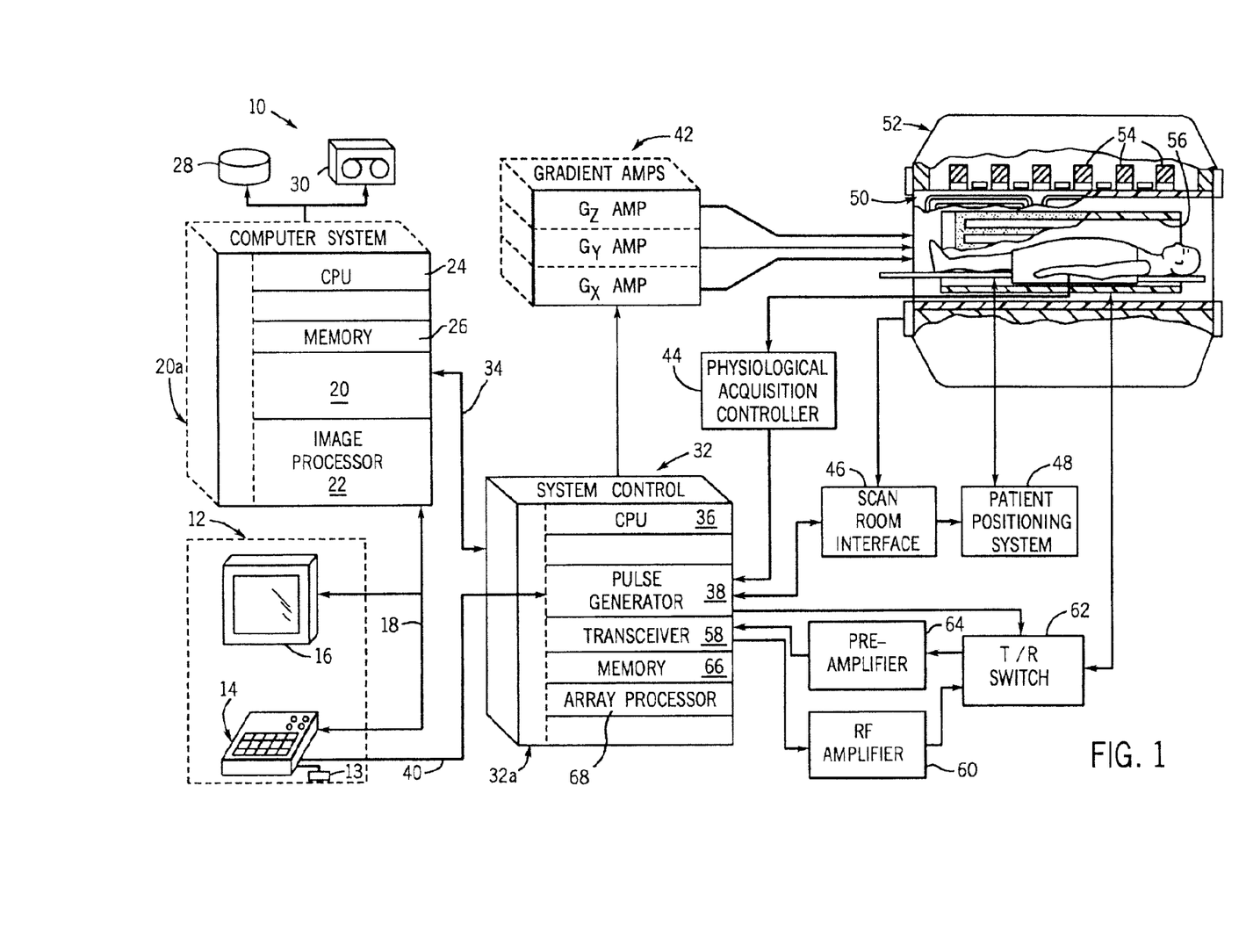
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention includes a method and system suitable for use with the above-referenced MR system, or any similar or equivalent system for obtaining MR images. While the present invention will be described with respect to a shoulder coil assembly, the present invention is equivalently applicable with other coil assemblies. By way of example and not limitation, the present invention may be applicable with a knee coil assembly.

Figure 2:
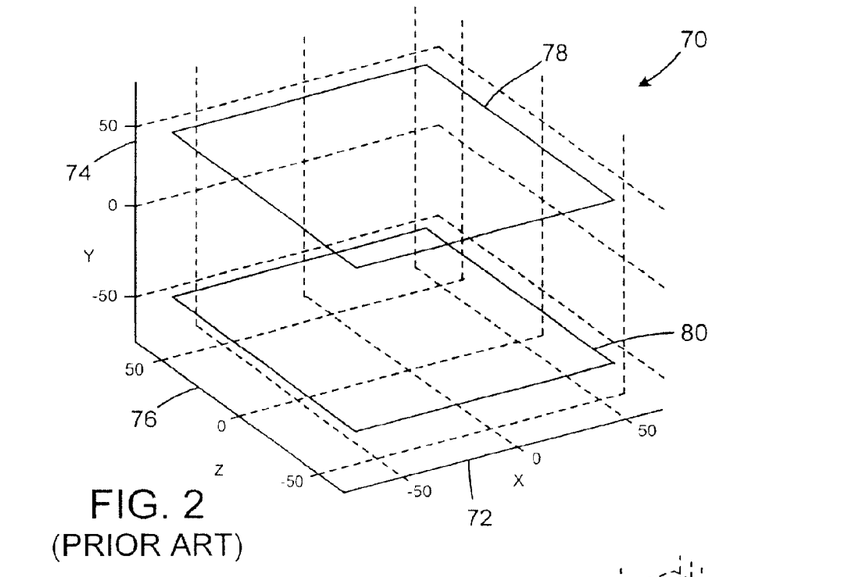
FIG. 2 is a schematic of a prior art shoulder coil assembly.

Referring now to FIG. 2, an RF coil assembly 70 is shown. RF coil assembly 70 may be a surface coil assembly to acquire data from a patient's shoulder. MR images may be acquired, for example, by placing the RF coil assembly 70 in close proximity to a patient's shoulder within an imaging volume of the MR system 10. RF coil assembly 70 occupies a three-dimensional space represented by an x-axis 72, a y-axis 74, and a z-axis 76. RF coil assembly 70 includes a first moveable coil loop 78 and a second moveable coil loop 80. First moveable coil loop 78 is shown to lie along a plane formed by the x-axis 72 and the z-axis 76. Second moveable coil loop 80 is parallel to first moveable coil loop 78 and is shown to lie along a second plane formed by the x-axis 72 and the z-axis 76.

A mutual inductance forms between the first moveable coil loop 78 and the second moveable coil loop 80 as the coil loops are powered and placed near each other. The magnitude of the mutual inductance increases as the distance between the first moveable coil loop 78 and the second moveable coil loop 80 decreases, in the illustrated example, along the y-axis 74. The mutual inductance that forms between first moveable coil loop 78 and second moveable coil loop 80 decreases in magnitude as the distance therebetween increases.

The orientation of the RF coil assembly 70 described above is not limited to the embodiment described. For example, the orientation of the coil loops may lie along a plane formed by the x-axis 72 and the y-axis 74 while the distance therebetween varies along the z-axis 76. The orientation of the coil loops may also lie along a plane formed by the y-axis 74 and the z-axis 76 while the distance therebetween varies along the x-axis 72. Furthermore, the orientation of the coil loops may lie along a plane formed by any combination of the x-axis 72, the y-axis 74, and the z-axis 76.

One skilled in the art will recognize that although the RF coil assembly shown in FIG. 2 illustrates first moveable coil loop 78 and second moveable coil loop 80 that are generally square shaped, other shapes are possible and contemplated.

Figure 3:
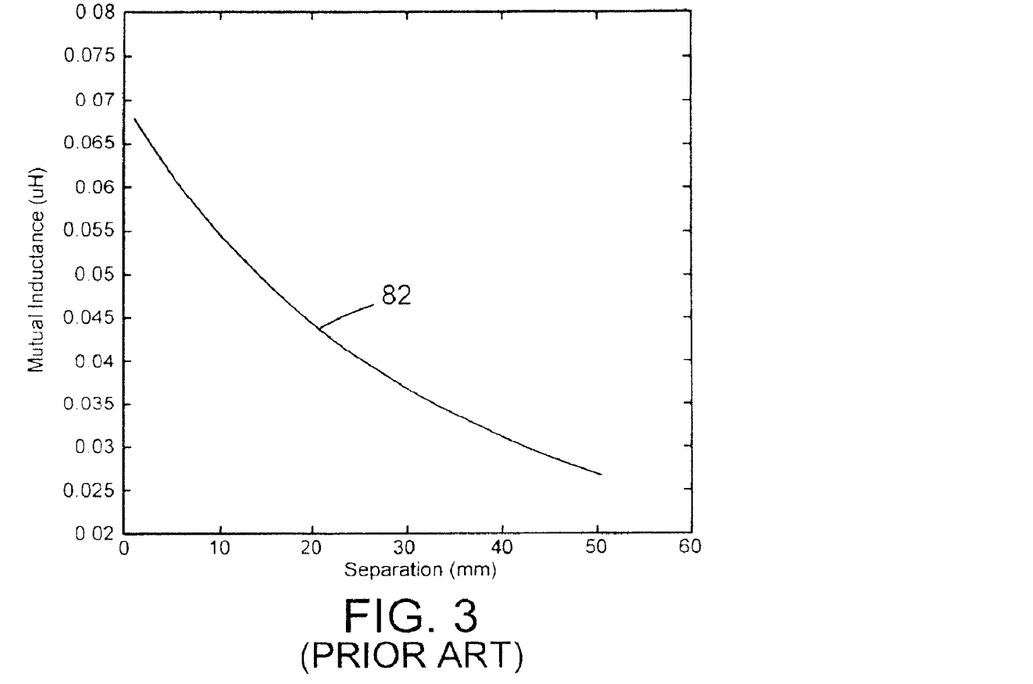
FIG. 3 is a graphical representation of mutual inductance of the shoulder coil assembly of FIG. 2 as the separation between the coils varies.

FIG. 3 is a graph illustrating one example of the mutual inductance that may form between first moveable coil loop 78 and second moveable coil loop 80 as a function of coil loop separation. A mutual inductance curve 82 is shown generally to indicate that the magnitude of mutual inductance decreases as a linear separation of first moveable coil loop 78 and second moveable coil loop 80 increases. Conversely, the magnitude of mutual inductance increases as a linear separation of first moveable coil loop 78 and second moveable coil loop 80 decreases. An increase in mutual inductance, or coupling, causes a change in the current and voltage of one coil loop to increasingly affect the current and voltage of the other coil loop. As stated above, coupling of the coil loops may cause detuning of the coil loops, loading of the coil loops, and the degradation of image quality. Substantially minimizing coil loop coupling reduces the effect a change in current and voltage in one coil loop has on the other, thus restoring image quality.

Figure 4:
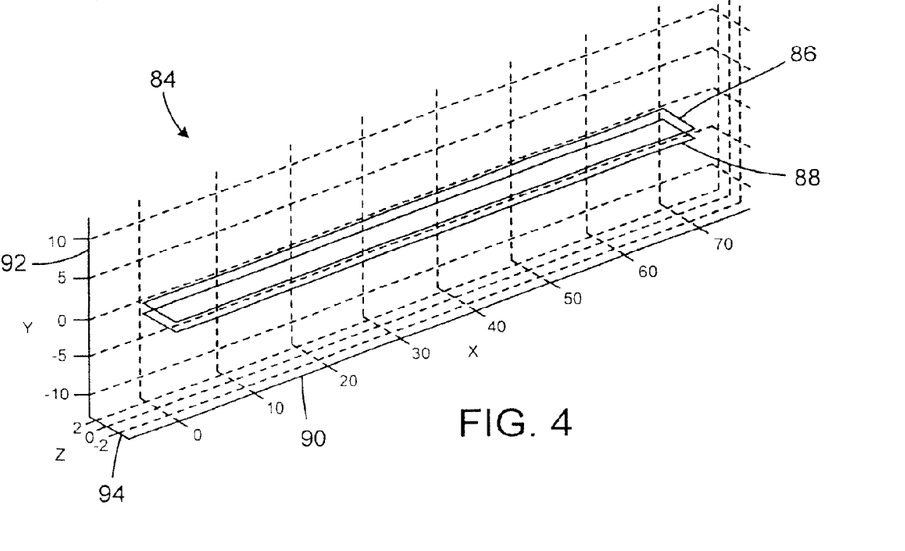
FIG. 4 is a schematic of a mutual inductance compensation circuit in accordance with the present invention.

A mutual inductance compensation circuit 84 in accordance with the present invention is shown in FIG. 4. Mutual inductance compensation circuit 84 includes a first inductor assembly 86 and a second inductor assembly 88 that occupies a three-dimensional space represented by an x-axis 90, a y-axis 92, and a z-axis 94. A coupling of first inductor assembly 86 and second inductor assembly 88 forms therebetween as the inductor assemblies overlap one another. The mutual inductance of the inductor assemblies decreases as the amount of overlap decreases. The first inductor assembly 86 and the second inductor assembly 88 are calibrated so that a negatively phased mutual inductance forms therebetween when the inductor assemblies overlap. The magnitude of the negatively phased mutual inductance substantially equals the magnitude of the mutual inductance that forms between the first moveable coil loop 78 and the second moveable coil loop 80 as the coil loops move with respect to each other. Thus, as will be described below, the negatively phased mutual inductance of the inductor assemblies varies with position of the RF coils, thereby canceling or substantially minimizing the mutual inductance that forms between the first moveable coil loop 78 and the second moveable coil loop 80.

Figure 5:
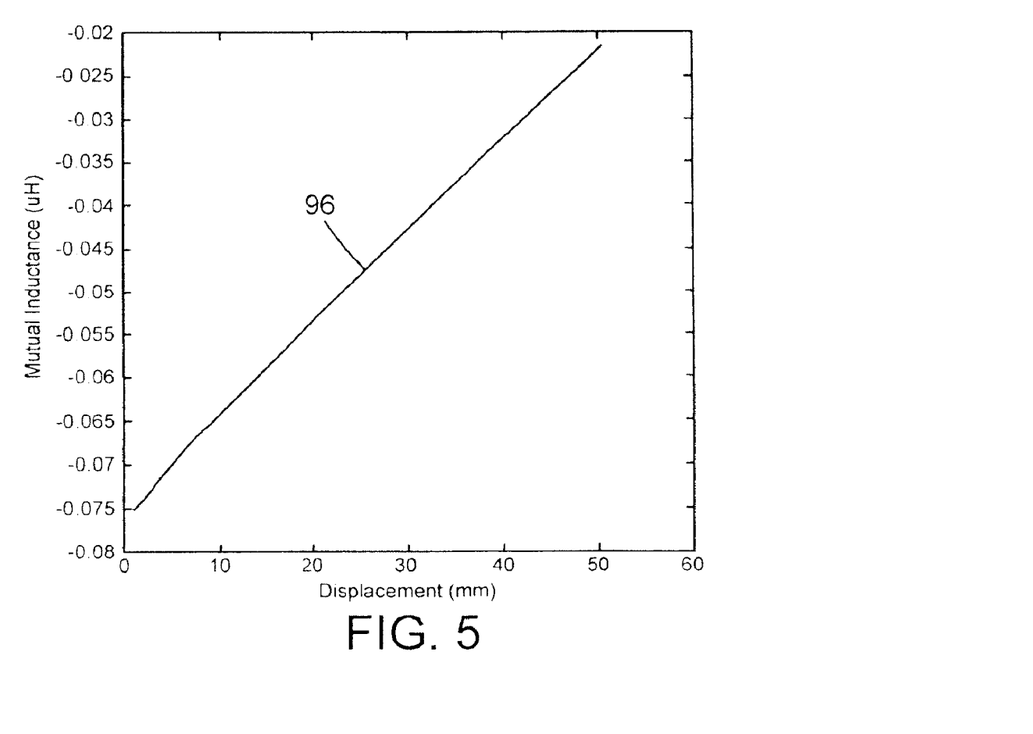
FIG. 5 is a graphical representation of mutual inductance of the mutual inductance compensation circuit of FIG. 4 as a relative position of inductor assemblies varies.

The mutual inductance that forms between the first inductor assembly 86 and second inductor assembly 88 is shown in FIG. 5. As illustrated by the mutual inductance curve 96, the magnitude of the mutual inductance of the inductor assemblies decreases as the overlap therebetween decreases. Conversely, the magnitude of the mutual inductance of the inductor assemblies increases as the overlap increases. That is, the relative displacement of the inductor assemblies inversely affects the amount of mutual inductance therebetween.

Figure 6:
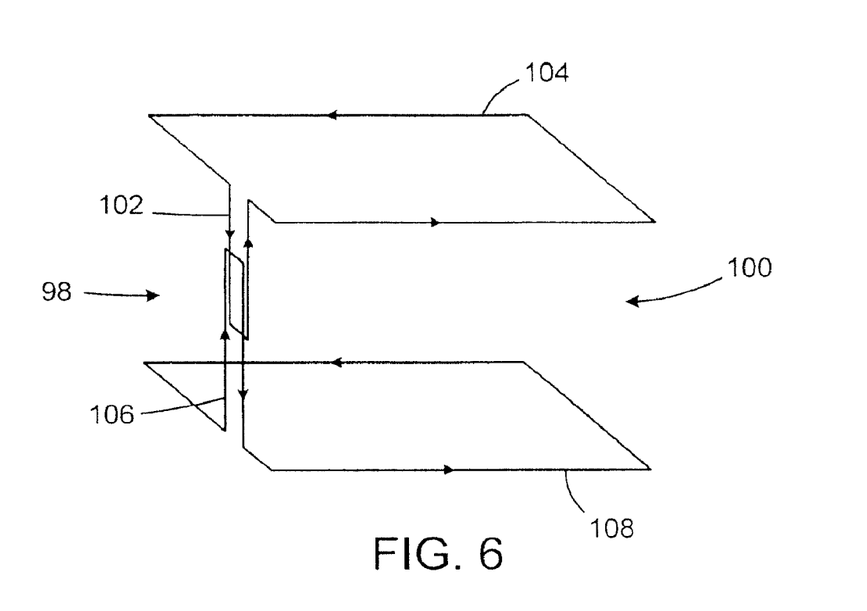
FIG. 6 is a schematic of an RF coil assembly in accordance with one embodiment of the present invention.

FIG. 6 illustrates one embodiment of a mutual inductance compensation circuit 98 incorporated in an RF coil assembly 100. A first inductor assembly 102 of mutual inductance compensation circuit 98 is constructed to connect in series with a first moveable coil loop 104 of the RF coil assembly 100 and to extend orthogonally from the plane of the first moveable coil loop 104 in a direction towards the second moveable coil loop 108. A second inductor assembly 106 is constructed to connect in series with a second moveable coil loop 108 of the RF coil assembly 100 and to extend orthogonally from the plane of the second moveable coil loop 108 in a direction towards the first moveable coil loop 104. The RF coil assembly 100 is constructed so that the first moveable coil loop 104 is in parallel with the second moveable coil loop 108. In this manner, as the size of the volume of interest changes, the linear distance between the coil loops may vary according to the size of the volume of interest.

Inductor assemblies 102, 106 are constructed to overlap as the distance between first moveable coil loop 104 and second moveable coil loop 108 varies. The mutual inductance compensation circuit 98 is calibrated such that as the first inductor assembly 102 and the second inductor assembly 106 overlap, the magnitude of mutual inductance that forms therebetween substantially equals and is opposite in phase and polarity to the mutual inductance that forms between the first moveable coil loop 104 and the second moveable coil loop 108 as the coil loops move with respect to each other. As the distance between the first moveable coil loop 104 and the second moveable coil loop 108 decreases, the mutual inductance that forms therebetween increases, and the overlap of the first inductor assembly 102 and the second inductor assembly 106 increases. The increase in inductor assembly overlap causes the magnitude of the mutual inductance formed therebetween to increase so as to substantially equal the increased magnitude of the coil loops as the distance therebetween is decreased. As the distance between the first moveable coil loop 104 and the second moveable coil loop 108 increases, the mutual inductance that forms therebetween decreases, and the overlap of the first inductor assembly 102 and the second inductor assembly 106 decreases. The decrease in inductor assembly overlap causes the magnitude of the mutual inductance formed therebetween to decrease so as to substantially equal the decreased magnitude of the coil loops as the distance therebetween is increased.

Figure 7:
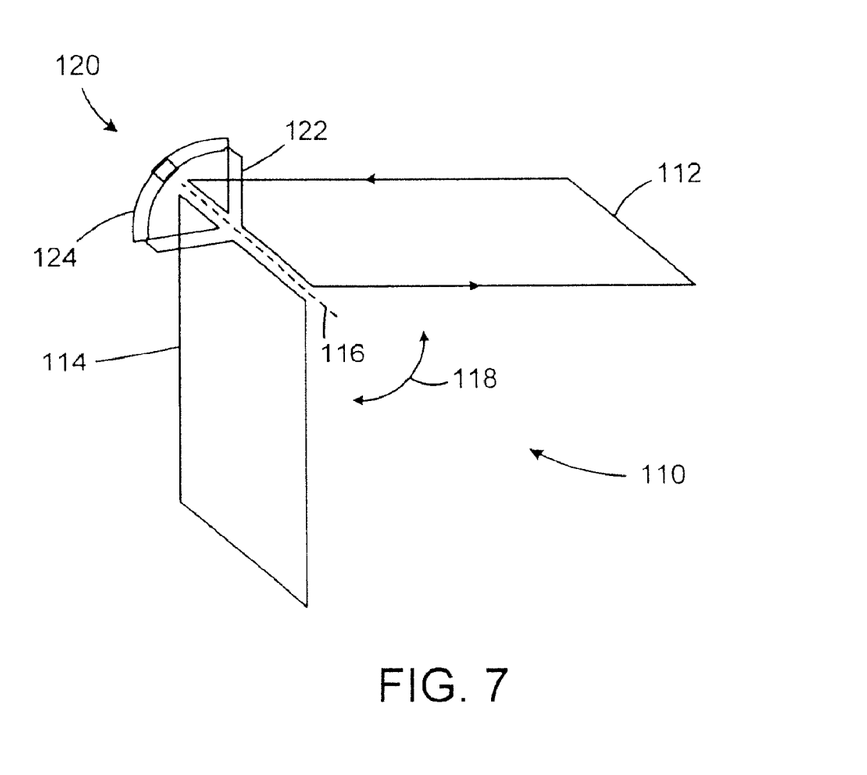
FIG. 7 is a schematic of another embodiment of the RF coil assembly in accordance with the present invention.

FIG. 7 shows another embodiment of an RF coil assembly 110. The RF coil assembly 110 includes, similar to coil assembly 100 of FIG. 6, a first moveable coil loop 112 rotatable relative to a second moveable coil loop 114 about an axis of rotation 116. The magnitude of the angle 118 that forms between the first moveable coil loop 112 and the second moveable coil loop 114 is increased to accommodate a larger angular volume of interest and decreased to accommodate a smaller angular volume of interest. As the magnitude of angle 118 increases, the magnitude of the mutual inductance formed between the first moveable coil loop 112 and the second moveable coil loop 114 increases. Conversely, as the magnitude of angle 118 decreases, the magnitude of the mutual inductance formed between the first moveable coil loop 112 and the second moveable coil loop 114 decreases.

To substantially minimize the coupling of the first moveable coil loop 112 and the second moveable coil loop 114, the mutual inductance compensation circuit 120 is constructed and calibrated such that as a first inductor assembly 122 and a second inductor assembly 124 overlap, the magnitude of mutual inductance that forms therebetween substantially equals and is opposite in phase and polarity to the mutual inductance that forms between first moveable coil loop 112 and second moveable coil loop 114 as the coil loops rotate with respect to each other about the axis of rotation 116. The mutual inductance compensation circuit 120 is also constructed such that mutual inductance between the first inductor assembly 122 and the second inductor assembly 124 increases as the magnitude of angle 118 increases and decreases as the magnitude of angle 118 decreases.

The mutual inductance compensation circuit 120 of FIG. 7 includes a first inductor assembly 122 and a second inductor assembly 124. The first inductor assembly 122 is constructed to be in series with the first moveable coil loop 112 near the axis of rotation 116 and to extend in a direction opposite the direction of the volume of interest from the axis of rotation 116. The second inductor assembly 124 is constructed to be in series with second moveable coil loop 114 near the axis of rotation 116 and to extend in a direction opposite the direction of the volume of interest from the axis of rotation 116. The first inductor assembly 122 and the second inductor assembly 124 further extend towards one another in a curvilinear manner such that the width, or separation, between the inductors remains substantially constant about the area of overlap during coil loop rotation.

The present invention includes an RF coil assembly that includes a pair of RF coils movable with respect to one another. The RF coil assembly includes a first inductor assembly in series with one RF coil and a second inductor assembly in series with the other RF coil. A mutual inductance forms between the inductor assemblies that is opposite in polarity and substantially equal in magnitude to a mutual inductance that forms between the pair of RF coils.

In a further embodiment of the present invention, an MRI apparatus includes a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images. The RF coil assembly further includes a first moveable coil loop and a second moveable coil loop. The RF coil assembly also further includes a mutual inductance compensation circuit connected to the first and the second moveable coil loops such that the compensation circuit generates an inductance that minimizes a coupling of the first and the second coil loops independent of coil loop position relative to one another.

In yet a further embodiment of the present invention, a method of manufacturing an RF coil assembly includes the steps of connecting a first inductor assembly in series with a first RF coil and connecting a second inductor assembly in series with a second RF coil. The method further includes calibrating the first inductor assembly and the second inductor assembly such that a mutual inductance therebetween substantially isolates the first and the second RF coils independent of coil position relative to one another.

The present invention has been described in terms of the preferred embodiments, and it is recognized that equivalents, alternatives, and modifications, aside from those expressly stated, are possible and within the scope of the appending claims.

What is claimed is:

1. An RF coil assembly comprising:
   a pair of RF coils movable with respect to one another;
   a first inductor assembly in series with one RF coil;
   a second inductor assembly in series with the another RF coil; and
   wherein the inductor assemblies are configured to have a mutual inductance opposite in polarity arid substantially equal in magnitude to a mutual inductance of the pair of RF coils.

2. The RF coil assembly of claim 1 wherein the inductor assemblies are configured to cancel the mutual inductance of the pair of RF coils with varying relative position of the pair of RF coils as long as the first and second inductor assemblies overlap.

3. The RF coil assembly of claim 2 wherein the RF coils in the pair of RF coils are movable alone at least one of an x-axis, a y-axis, and a z-axis.

4. The RF coil assembly of claim 3 wherein the RF coils in the pair of RF coils are rotatable about an axis of rotation.

5. The RF coil assembly of claim 3 wherein the RF coils in the pair of RF coils are translatable along an imaging plane.

6. The RF coil assembly of claim 1 wherein the inductor assemblies collectively have a mutual inductance opposite in phase to that of the pair of RF coils.

7. The RF coil assembly of claim 1 wherein the mutual inductance of the inductor assemblies varies with RF coil positioning in a manner to cancel the mutual inductance of the pair of RF coils.

8. The RF coil assembly of claim 7 wherein the mutual inductance of the indicator assemblies decreases as a distance between the pair of RF coils increases and increases as the distance between the pair of RF coils decreases.

9. The RF coil assembly of claim 1 wherein the inductance of the inductor assemblies is such that coupling of the pair of RF coils is reduced regardless of coil position.

10. The RF coil assembly of claim 1 incorporated into an MRI system having a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images.

11. An MRI apparatus comprising:
   a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images, the RF coil assembly comprising:
   a first moveable coil loop;
   a second moveable coil loop;
   a mutual inductance compensation circuit connected to the first and the second moveable coil loops; and
   wherein the compensation circuit is constructed to generate an inductance that minimizes a coupling of the first and the second coil loops independent of coil loop position relative to one another.

12. The MRI apparatus of claim 11 wherein the mutual inductance compensation circuit is constructed such that the generated inductance is opposite in polarity and substantially equal in magnitude to mutual inductance of the first and second coil loops.

13. The MRI apparatus of claim 12 wherein the inductance generated by the mutual inductance compensation circuit varies with position of the first moveable coil loop and the second moveable coil loop relative to one another.

14. The MRI apparatus of claim 11 wherein the first moveable coil loop and the second moveable coil loop are movable with respect to each other along at least one of an x-axis, a y-axis, and a z-axis.

15. The MRI apparatus of claim 14 wherein at least one of the first moveable coil loop and the second moveable coil loop is rotatable about an axis of rotation.

16. The MRI apparatus of claim 15 wherein the mutual inductance compensation circuit is constructed to increase the inductance generated as a relative angle of the first moveable coil to the second moveable coil increases in magnitude.

17. The MRI apparatus of claim 11 wherein the first moveable coil loop and the second moveable coil loop collectively form a coil for acquiring MR data of a region of a patient.

18. The MRI apparatus of claim 11 wherein the mutual inductance compensation circuit includes a first inductor in series with the first moveable coil loop and a second inductor in series with the second moveable coil loop.

19. A method of manufacturing an RF coil assembly comprising the steps of:
   connecting a first inductor assembly in series with a first RF coil;
   connecting a second inductor assembly in series with a second RF coil; and
   calibrating the first inductor assembly and the second inductor assembly such that a mutual inductance therebetween substantially isolates the first and the second RF coils independent of coil position relative to one another.

20. The method of claim 19 wherein the mutual inductance of the first and the second inductor assemblies is opposite in polarity and substantially equal in magnitude to a mutual inductance of the first and the second RF coils.

21. The method of claim 19 further comprising the step of constructing the first and the second RF coils in parallel with one another.

22. The method of claim 21 further comprising the step of constructing the inductor assemblies such that the mutual inductance therebetween decreases as a distance between the first RF coil and the second RF coil increases, and such that the mutual inductance therebetween increases as the distance between the first RF coil and the second RF coil decreases.

23. The method of claim 19 further comprising the step of constructing the first and the second RF coils to rotate relative to one another about an axis of rotation.

24. The method of claim 23 further comprising the step of constructing the inductor assemblies such that the mutual inductance therebetween increases as a relative angle between the first RF coil and the second RF coil increases, and such that the mutual inductance therebetween decreases as the relative angle between the first RF coil and the second RF coil decreases.

* * * * *

UNITED STATES PATENT AND TRADEMARK OFFICE
CERTIFICATE OF CORRECTION

PATENT NO. : 6,919,723 B2 Page 1 of 1
APPLICATION NO. : 10/604299
DATED : July 19, 2005
INVENTOR(S) : Davis It is certified that error appears in the above-identified patent and that said Letters Patent is hereby corrected as shown below:

Col. 7, line 35 (Claim 1), delete "arid" and substitute therefore --and--.

Signed and Sealed this

Twenty-ninth Day of January, 2008

JON W. DUDAS
*Director of the United States Patent and Trademark Office*